US009491851B2

(12) United States Patent
Lin et al.

(10) Patent No.: US 9,491,851 B2
(45) Date of Patent: Nov. 8, 2016

(54) CONNECTION STRUCTURE OF ELECTRONIC DEVICE

(71) Applicant: WINTEK CORPORATION, Taichung (TW)

(72) Inventors: Jung-Sung Lin, Taichung (TW);
Hsua-Yun Lee, Taichung (TW);
Pin-Hao Chi, Taichung (TW);
Chih-Yuan Lin, Taichung (TW);
Ming-Chuan Lin, Taichung (TW)

(73) Assignee: WINTEK CORPORATION, Taichung (TW)

( * ) Notice: Subject to any disclaimer, the term of this patent is extended or adjusted under 35 U.S.C. 154(b) by 225 days.

(21) Appl. No.: 14/339,470

(22) Filed: Jul. 24, 2014

(65) Prior Publication Data

US 2015/0029636 A1    Jan. 29, 2015

(30) Foreign Application Priority Data

Jul. 26, 2013    (TW) .............................. 102126907 A

(51) Int. Cl.
| | | |
|---|---|---|
| *H02H 9/00* | (2006.01) | |
| *H05K 1/02* | (2006.01) | |
| *H05F 3/00* | (2006.01) | |
| *H05F 3/02* | (2006.01) | |
| *H01R 13/648* | (2006.01) | |
| *H01R 12/71* | (2011.01) | |
| *H01R 12/70* | (2011.01) | |
| *H01R 12/77* | (2011.01) | |
| *H05K 1/11* | (2006.01) | |

(52) U.S. Cl.
CPC ........ *H05K 1/0259* (2013.01); *H01R 13/6485* (2013.01); *H05F 3/00* (2013.01); *H05F 3/02* (2013.01); *H01R 12/7005* (2013.01); *H01R 12/714* (2013.01); *H01R 12/775* (2013.01); *H05K 1/111* (2013.01); *H05K 1/113* (2013.01); *H05K 2201/097* (2013.01); *H05K 2201/09354* (2013.01); *H05K 2201/09409* (2013.01); *H05K 2201/09445* (2013.01)

(58) Field of Classification Search
CPC ................................................... H05K 1/0259
USPC ........................................................ 361/220
See application file for complete search history.

(56) References Cited

U.S. PATENT DOCUMENTS

| | | | | |
|---|---|---|---|---|
| 5,315,472 | A * | 5/1994 | Fong ......................... | H05F 3/02 347/50 |
| 6,291,114 | B1 * | 9/2001 | Reijers ..................... | G03F 1/40 361/212 |
| 7,479,680 | B2 * | 1/2009 | Dunnihoo ......... | H01L 23/49541 257/355 |
| 7,606,046 | B2 * | 10/2009 | Han ..................... | H05K 1/0259 361/760 |
| 8,916,782 | B2 * | 12/2014 | Wu ..................... | H05K 1/0259 174/257 |

\* cited by examiner

*Primary Examiner* — Stephen W Jackson
(74) *Attorney, Agent, or Firm* — Ming Chow; Sinorica, LLC

(57) ABSTRACT

A connection structure of an electronic device includes a circuit board, a plurality of conductive contact pads and a conductive pattern. The conductive contact pads and the conductive pattern are disposed on the circuit board. The conductive contact pads are electrically insulated from one another. The conductive pattern is electrically insulated from the conductive contact pads. The conductive pattern is disposed on at least three sides of the conductive contact pads so as to generate an electrostatic discharge protection effect for the conductive contact pads.

10 Claims, 8 Drawing Sheets

CONNECTION STRUCTURE OF ELECTRONIC DEVICE

BACKGROUND OF THE INVENTION

1. Field of the Invention

The present invention generally relates to a connection structure of an electronic device, and more particularly, to a connector including a conductive pattern surrounding conductive contact pads for generating an electrostatic discharge protection effect.

2. Description of the Prior Art

As shown in FIG. 1, in a conventional ZIP-connector 100 of a flexible circuit board or a flexible printed circuit, conductive contact pads (also called "golden fingers") 120 are aligned and disposed on a circuit board 110. The conductive contact pads of the ZIP-connector 100 are used to be inserted into a connector (not shown) so as to contact and be electrically connected to the connector. On the circuit board 110, the conductive contact pads are electrically connected to a device, such as an integrated circuit (not shown). Therefore, the integrate circuit may be directly damaged and out of order when the conductive contact pads suffer electrostatic discharge. In the ZIP-connector 100, ground contact pads 130 are generally disposed only on two sides of the conductive contact pads 120, and the electrostatic discharge protection performance will be limited when technical operators directly take the ZIP-connector 100 by hands. Additionally, it is hard to dispose electrostatic discharge protection circuits respectively for each one of the conductive contact pads 120 according to manufacturing cost and design considerations. As the circuit layout design in the flexible circuit board becomes more complicated, the disposition density of the conductive contact pads 120 has to be increased, and the corresponding conductive wirings also have to become thinner and that will go against the electrostatic discharge protection.

SUMMARY OF THE INVENTION

It is one of the objectives of the present invention to provide a connection structure of an electronic device. A conductive pattern is used to surround conductive contact pads so as to generate an electrostatic discharge protection effect for the conductive contact pads in the connection structure.

To achieve the purposes described above, a preferred embodiment of the present invention provides a connection structure of an electronic device. The connection structure includes a circuit board, a plurality of conductive contact pads and a conductive pattern. The conductive contact pads and the conductive pattern are disposed on the circuit board. The conductive contact pads are electrically insulated from one another. The conductive pattern is electrically insulated from the conductive contact pads. The conductive pattern is disposed on at least three sides of the conductive contact pads so as to generate an electrostatic discharge protection effect for the conductive contact pads.

In the connection structure of the electronic device in the present invention, the conductive pattern is used to surround the conductive contact pads for generate the electrostatic discharge protection effect for the conductive contact pads and other components. Additionally, the conductive pattern may be directly disposed on a normal connection structure, and the purpose of the electrostatic discharge protection enhancement may be achieved without altering the structural design greatly and increasing additional manufacture costs.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
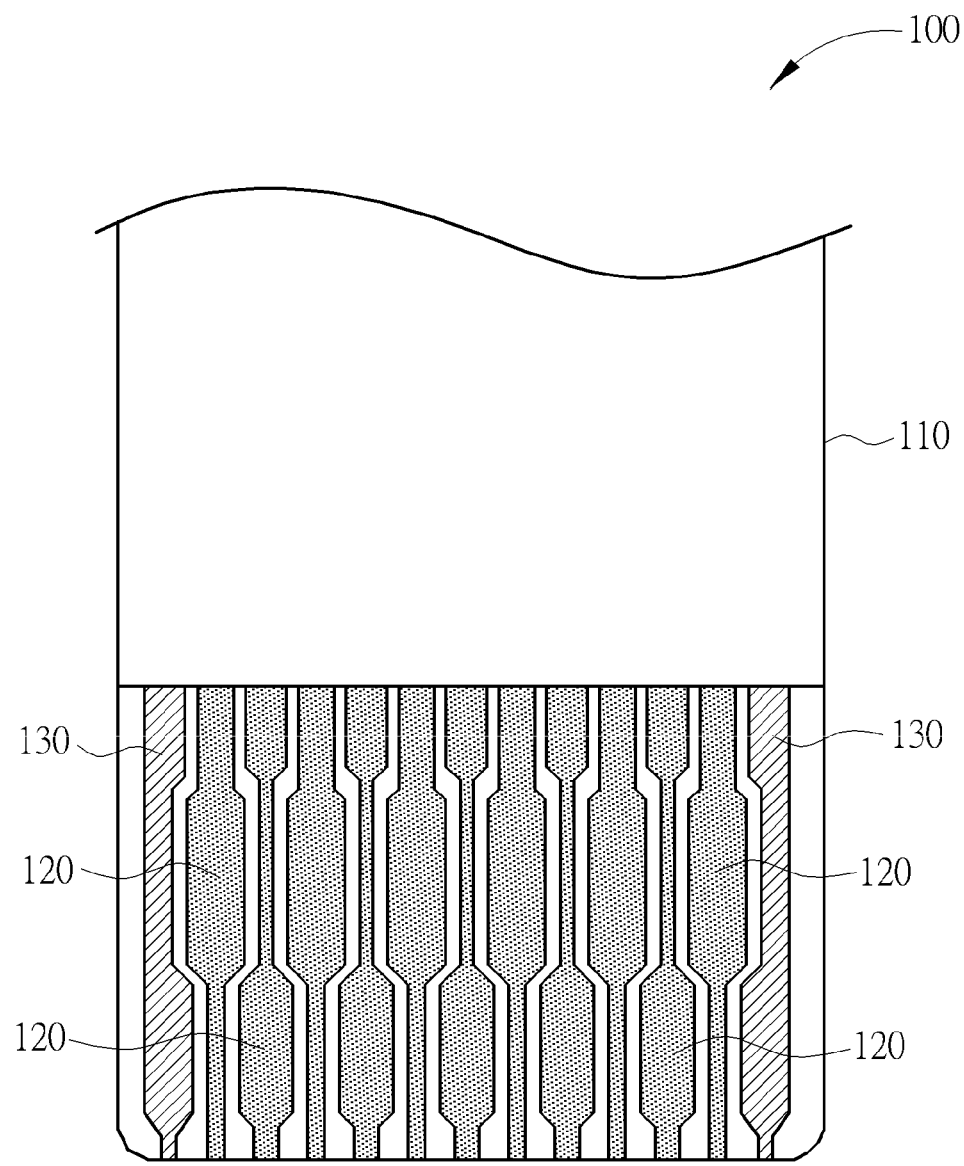
FIG. 1 is a schematic diagram illustrating a conventional ZIP-connector of a flexible circuit board.
Figure 2:
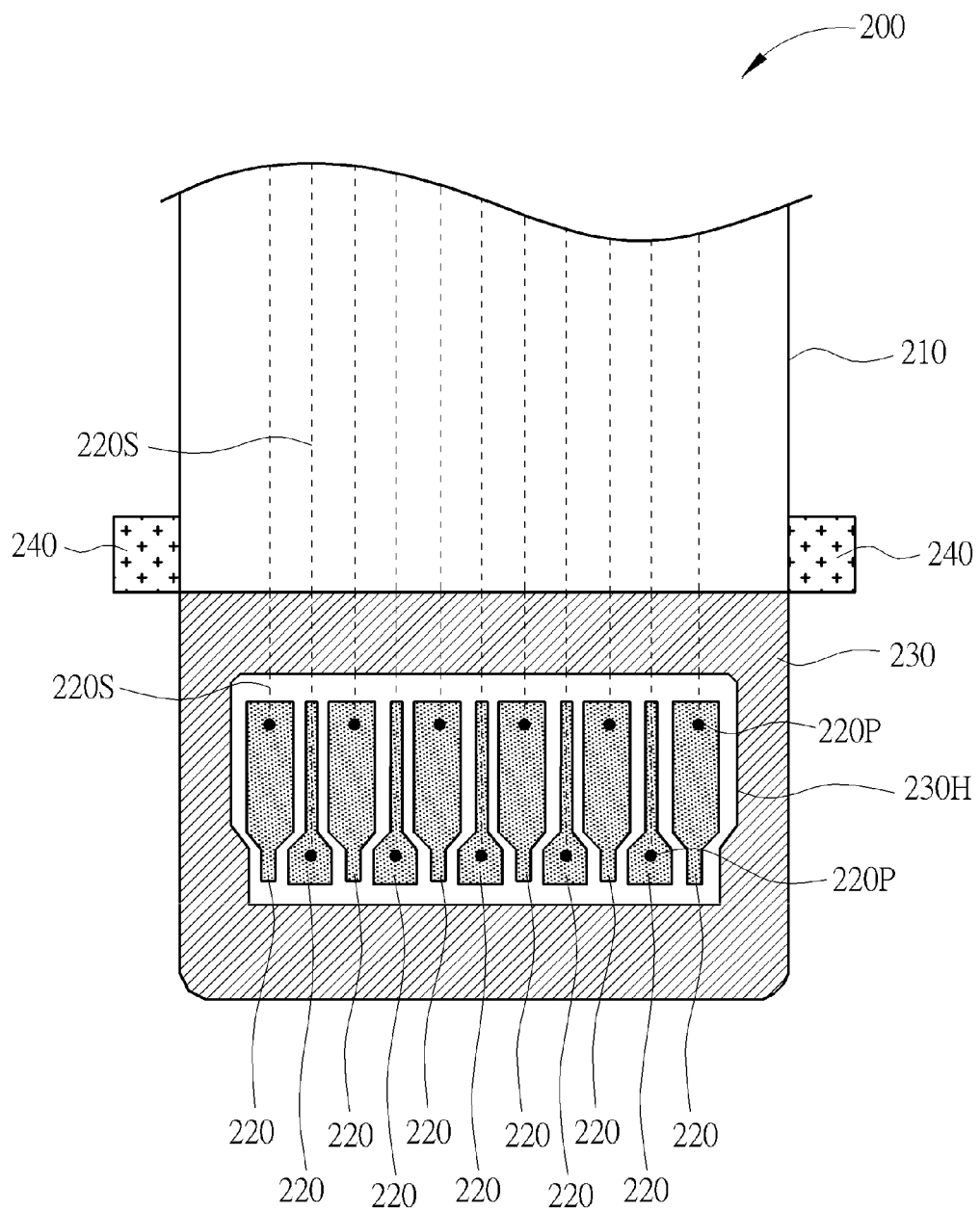
FIG. 2 is a schematic diagram illustrating a connection structure of an electronic device according to a first preferred embodiment of the present invention.

As shown in FIG. 2, the first preferred embodiment of the present invention provides a connection structure 200 of an electronic device. The connection structure 200 includes a circuit board 210, a plurality of conductive contact pads 220 and a conductive pattern 230. The conductive contact pads 220 and the conductive pattern 230 are disposed on the circuit board 210. The circuit board 210 in the present invention may include a flexible circuit board, a rigid circuit board or other circuit boards made of other appropriate materials. The conductive contact pads 220 are electrically insulated from one another, and the conductive pattern 230 is electrically insulated from the conductive contact pads 220. The conductive pattern 230 is disposed on at least three sides of the conductive contact pads 220 so as to generate an electrostatic discharge protection effect for the conductive contact pads 220. In this embodiment, the conductive pattern 230 may surround the conductive contact pads 220, but not limited thereto. The conductive contact pads 220 and the conductive pattern 230 are preferably made of metal materials with better conductivity, such as bare copper, but the present invention is not limited to this. For example, the conductive pattern 230 may also include at least one of aluminum, copper, silver, chromium, titanium and molybdenum, a composite layer of the above-mentioned materials, an alloy of the above-mentioned materials, or other conductive materials. In this embodiment, the conductive pattern 230 is preferably a square-shaped conductive pattern or a U-shaped conductive pattern (not shown in FIG. 2) disposed on at least three sides of the conductive contact pads 220. For instance, the conductive pattern 230 in FIG. 2 are disposed on four sides of the conductive contact pads 220 and surrounds the conductive contact pads 220, but the present invention is not limited thereto. In other preferred embodiments of the present invention, the conductive pattern 230 in other appropriate shapes may also be used to surround the conductive contact pads 220 according to other considerations. In this embodiment, the conductive pattern 230 may preferably include a closed pattern having a hollow region 230H, and the conductive contact pads 220 are disposed in the hollow region 230H. The electrostatic discharge protection effect against external electrostatic discharges for the conductive contact pads 220 may be effectively enhanced by the design of the conductive pattern 230 surrounding the conductive contact pads 220. In other words, the conductive pattern 230 may be regarded as an electrostatic discharge protection conductive pattern. Additionally, in this embodiment, an area of the conductive pattern 230 is preferably larger than a total area of the conductive contact pads 220 so as to effectively generate the required electrostatic discharge protection effect, but not limited thereto.

As shown in FIG. 2, the connection structure 200 of this embodiment may further include a plurality of signal lines 220S and an orientation structure 240. The signal lines 220S are electrically connected to the conductive contact pads 200 respectively, and the signal lines 220S are electrically insulated from the conductive pattern 230. One end of each signal line 220S is connected to one of the conductive contact pads 220, and the other end of each signal line 220S is connected to other components, such as an integrated circuit (not shown), on the circuit board 210, but not limited thereto. More specifically, each of the signal lines is preferably disposed at a lower layer of the circuit board 210, and each of the signal lines is electrically connected to the corresponding conductive contact pad 220 via a through hole 220P in the circuit board. It is worth noting that the connection structure 200 in this embodiment may be regarded as a ZIP-connector of the circuit board 210, and the orientation structure 240 may be used to control a depth of the connection structure 200 inserted into a connector (not shown). By using the orientation structure 240, contact points in the connector may be kept from contacting the conductive pattern 230 and influencing the normal operations. Additionally, in the connection structure 200 of this embodiment, the conductive pattern 230 may be directly disposed on a normal connection structure to improve the electrostatic discharge protection effect. The purpose of the electrostatic discharge protection enhancement may be achieved without altering the structural design greatly and increasing additional manufacture costs accordingly.

Figure 3:
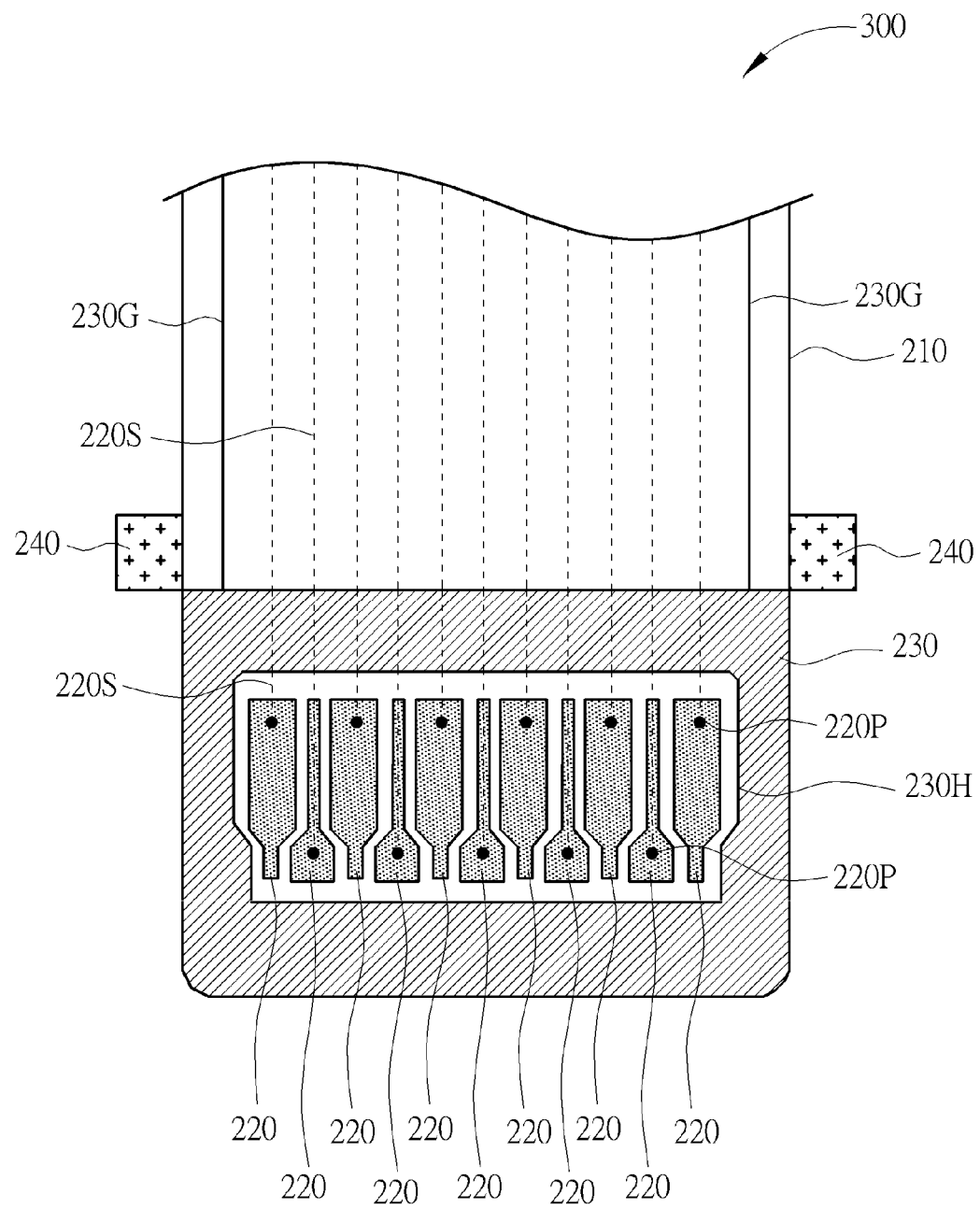
FIG. 3 is a schematic diagram illustrating a connection structure of an electronic device according to a second preferred embodiment of the present invention.

As shown in FIG. 3, the second preferred embodiment of the present invention provides a connection structure 300 of an electronic device. The connection structure 300 may further include at least one ground line 230G electrically connected to the conductive pattern 230. In other words, the conductive pattern 230 in this embodiment may be electrically grounded so as to further enhance the electrostatic discharge protection effect generated by the conductive pattern 230. According to the actual test results, an electrostatic discharge protection ability of a normal connection structure without the conductive pattern 230 ranges between 2 and 4 kilovolts (KV), and an electrostatic discharge protection ability of the connection structure 300 with the conductive pattern 230 may be enhanced to range between 9 and 13 KV. Apart from the ground line 230G, the characteristics, the material properties and the allocations of other components in the connection structure 300 of this embodiment are similar to those of the first preferred embodiment detailed above and will not be redundantly described.

Figure 4:
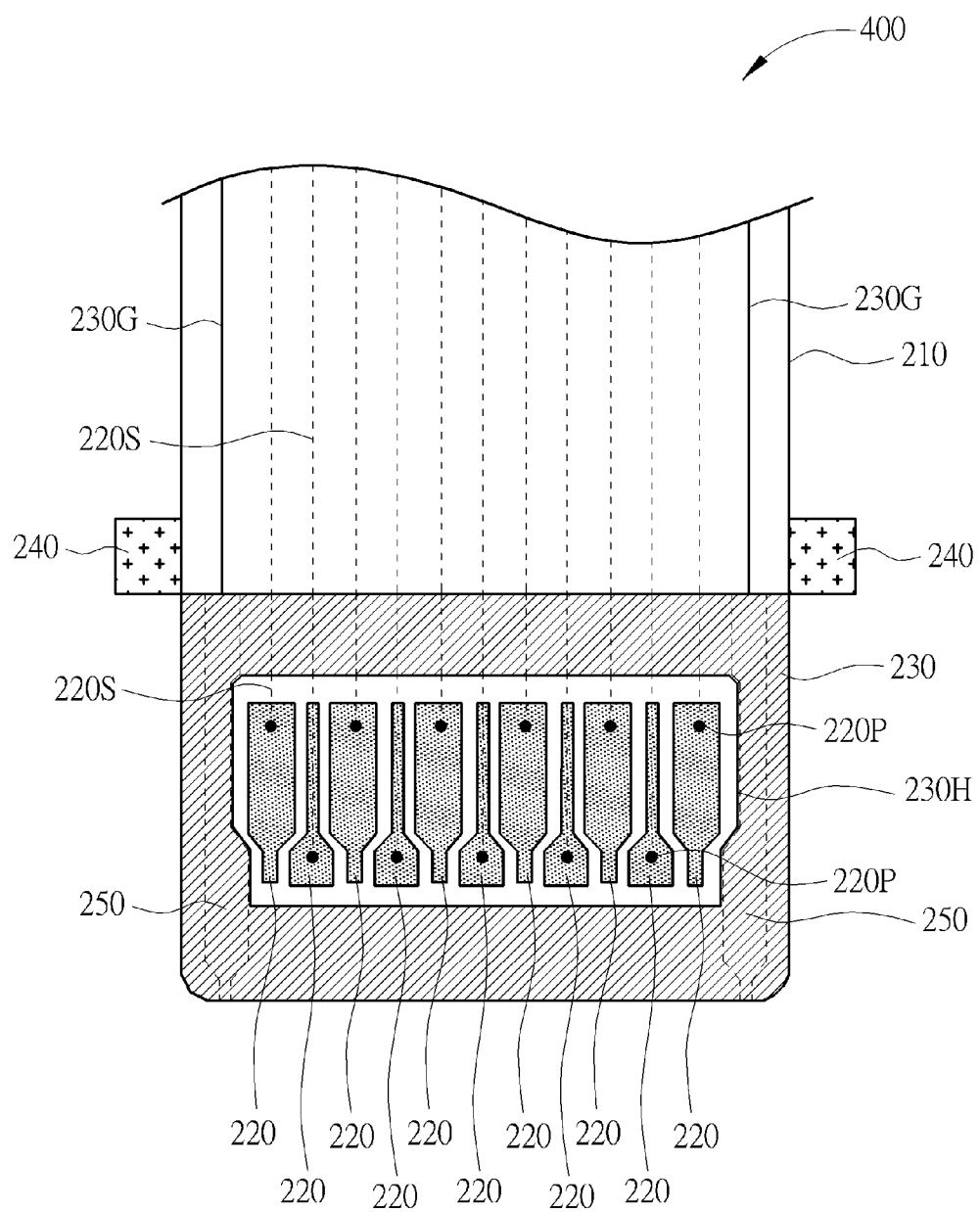
FIG. 4 is a schematic diagram illustrating a connection structure of an electronic device according to a third preferred embodiment of the present invention.

As shown in FIG. 4, the third preferred embodiment of the present invention provides a connection structure 400 of an electronic device. The connection structure 400 may further include at least one ground contact pad 250, and the conductive pattern 230 contacts the ground contact pad 250 so as to be electrically connected to the ground contact pad 250. It is worth noting that, similar to conventional connection structures, the connection structure 400 in this embodiment may also include two ground contact pads 250 disposed on two sides of the conductive contact pads 220 respectively. The conductive pattern 230 may directly contact the ground contact pads 250 disposed on the two sides of the conductive contact pads 220 so as to be electrically grounded. In the present invention, the conductive pattern 230 may be directly disposed on a normal connection structure to improve the electrostatic discharge protection effect. Additionally, the ground contact pads 250 may be electrically connected to the ground lines 230G respectively, but not limited thereto.

Figure 5:
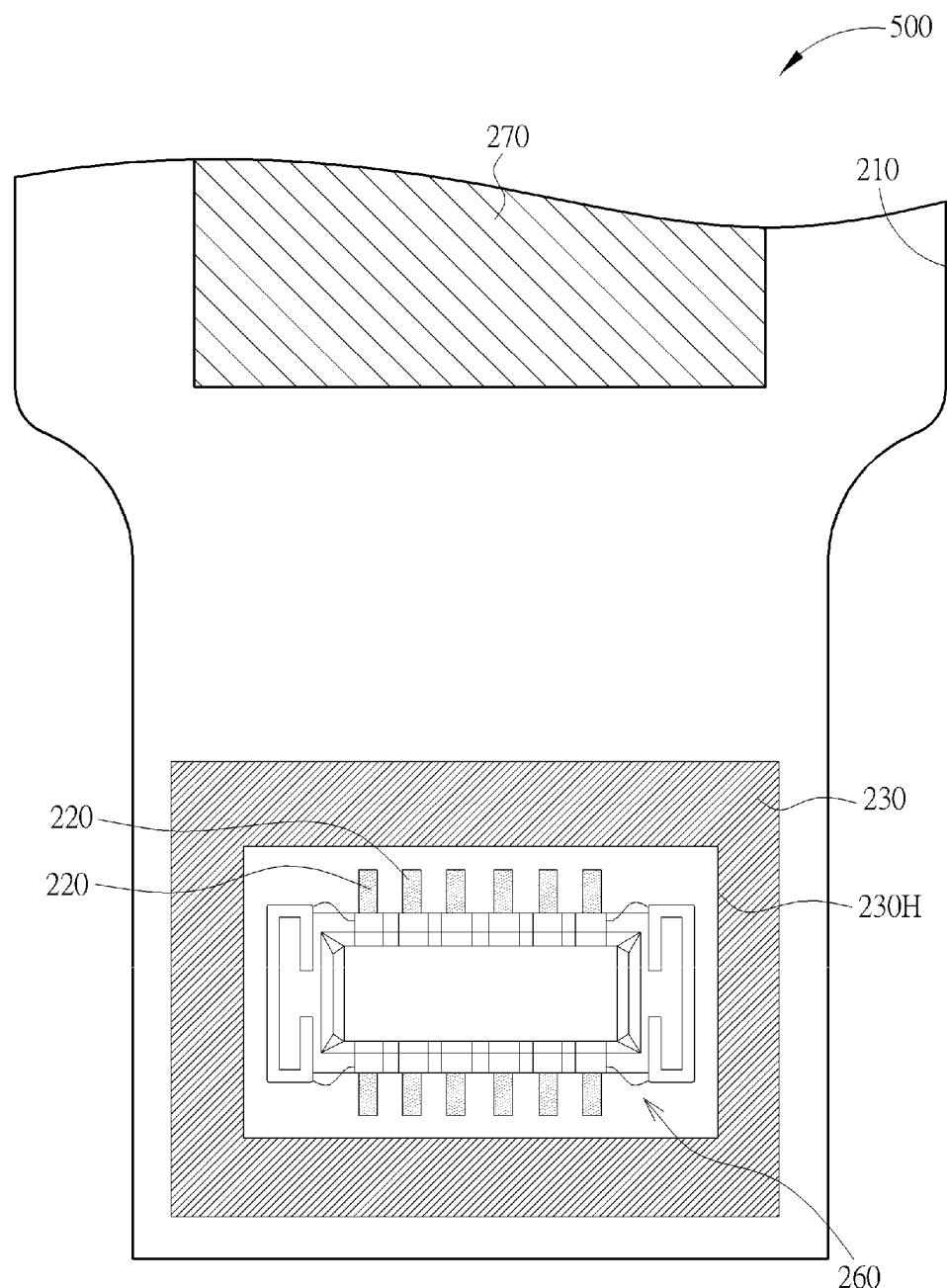
FIG. 5 is a schematic diagram illustrating a connection structure of an electronic device according to a fourth preferred embodiment of the present invention.

As shown in FIG. 5, the fourth preferred embodiment of the present invention provides a connection structure 500 of an electronic device. The connection structure 500 may further include a connector 260 and an integrated circuit (IC) 270 disposed on the circuit board 210. The conductive pattern 230 is electrically insulated from the connector 260 and the integrated circuit 270, and the conductive pattern 230 surrounds the connector 260. In other words, the connector 260 and the conductive contact pads 220 are disposed in the hollow region 230H of the conductive pattern 230, and the conductive pattern 230 may generate an electrostatic discharge protection for the connector 260 and the conductive contact pads 220. The integrated circuit 270 is disposed outside the hollow region 230H, and the integrated circuit 270 may be electrically connected to the conductive contact pads 220 via the circuit board 210, but not limited thereto. The connector 260 in this embodiment may be a board to board connector, and the circuit board 210 is preferably a flexible printed circuit (FPC), but not limited thereto.

Figure 6:
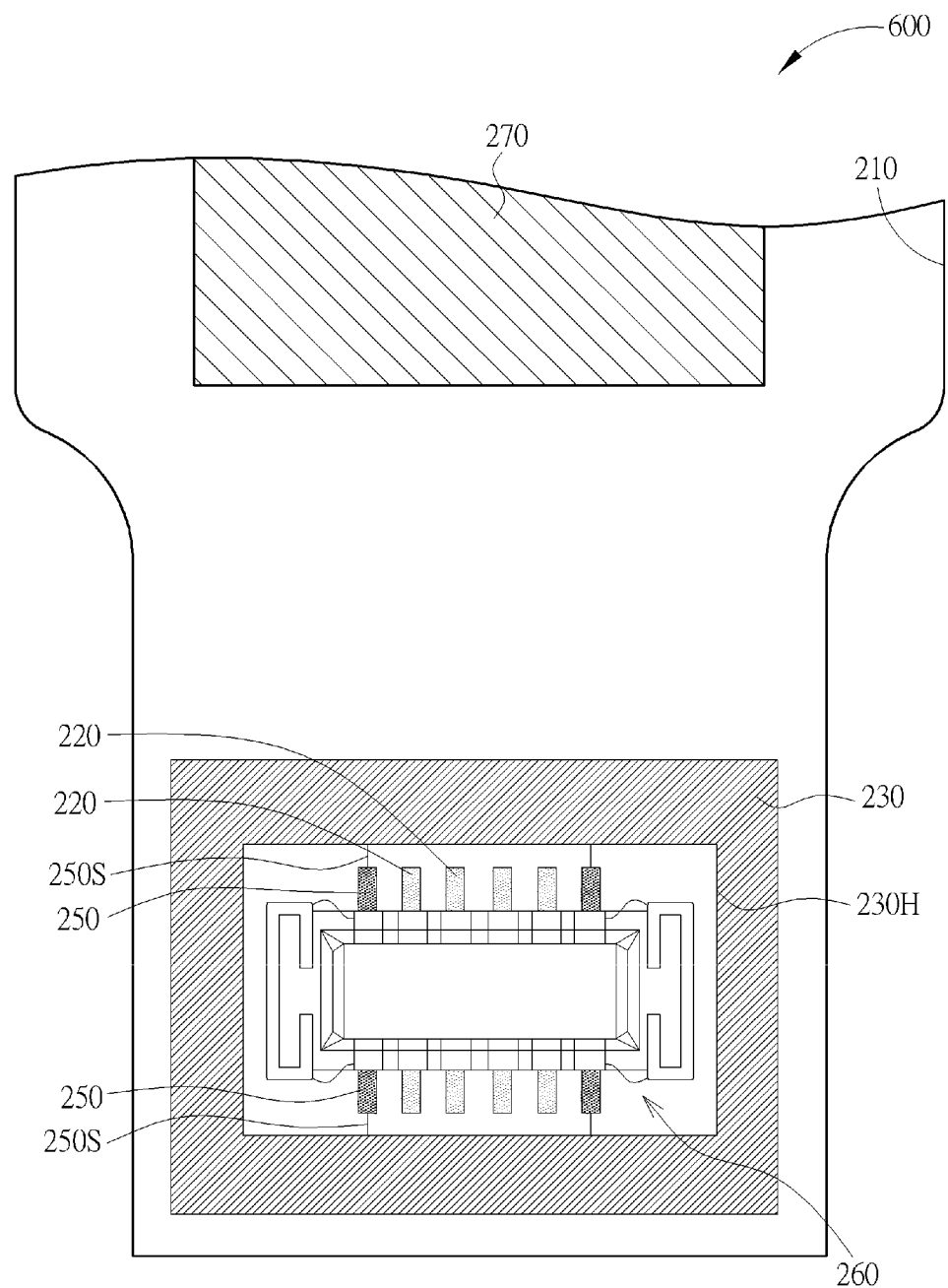
FIG. 6 is a schematic diagram illustrating a connection structure of an electronic device according to a fifth preferred embodiment of the present invention.

As shown in FIG. 6, the fifth preferred embodiment of the present invention provides a connection structure 600 of an electronic device. The connection structure 600 may further include a plurality of ground contact pads 250 and a plurality of conductive wirings 250S disposed in the hollow region 230H of the conductive pattern 230. The ground contact pads 250 are electrically insulated from the conductive contact pads 220, and the conductive pattern 230 surrounds the conductive contact pads 220 and the ground contact pads 250. In addition, the conductive pattern 230 may be electrically grounded by being electrically connected to the ground contact pads 250 via the conductive wirings 250S so as to further enhance the electrostatic discharge protection effect generated by the conductive pattern 230.

Figure 7:
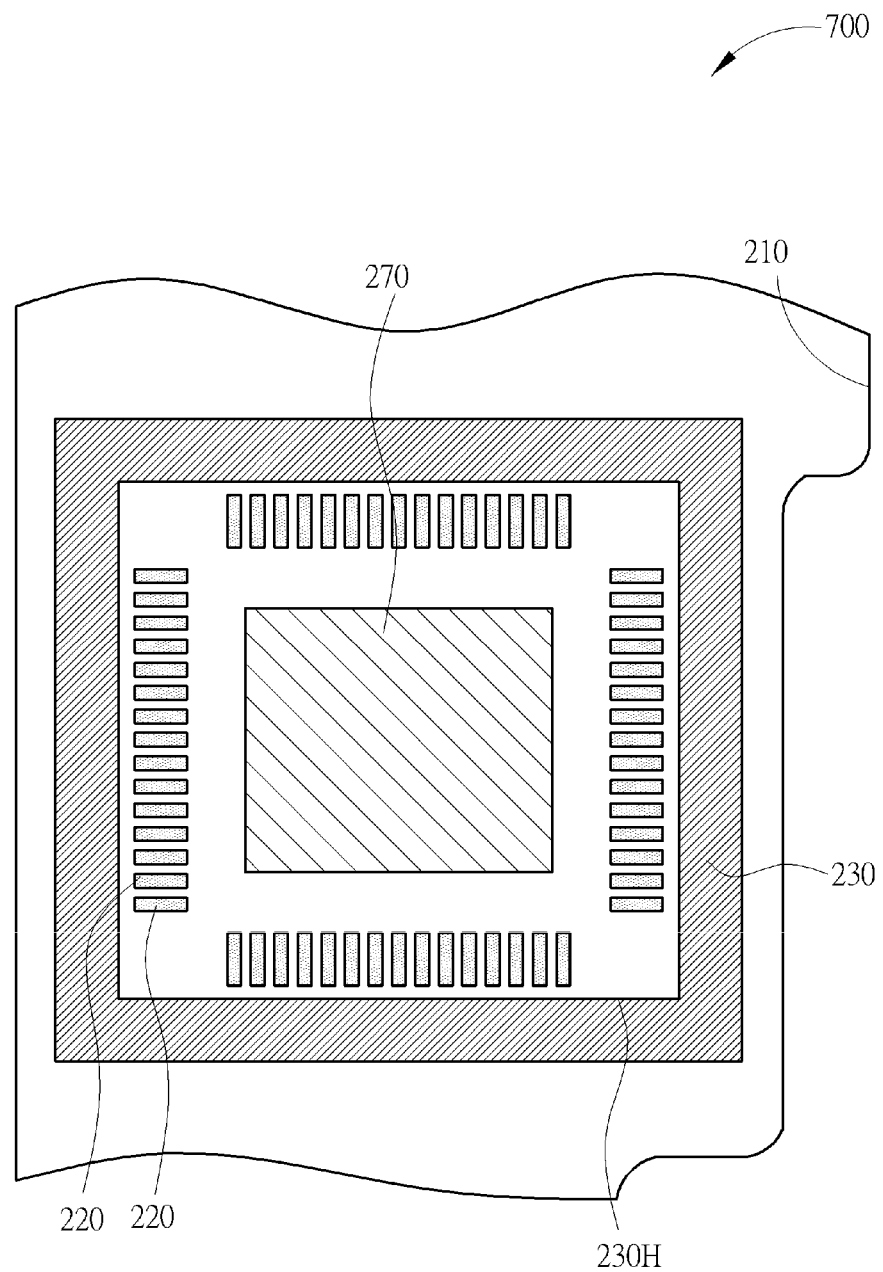
FIG. 7 is a schematic diagram illustrating a connection structure of an electronic device according to a sixth preferred embodiment of the present invention.

As shown in FIG. 7, the sixth preferred embodiment of the present invention provides a connection structure 700 of an electronic device. The difference between the connection structure 700 and the fourth preferred embodiment described above is that the integrated circuit 270 in this embodiment is disposed in the hollow region 230H of the conductive pattern 230. The conductive contact pads 220 are disposed to surround the integrated circuit 270. The conductive contact pads 220 are electrically connected to the integrated circuit 270. In other words, the conductive pattern 230 in this embodiment surrounds the integrated circuit 270 and the conductive contact pads 220. The conductive pattern 230 is used to improve the electrostatic discharge protection effect for the integrated circuit 270 and the conductive contact pads 220. It is worth noting that, similar to the embodiments described above, the conductive pattern 230 in this embodiment may also be electrically grounded by being electrically connected to the ground lines or the ground contact pads so as to further improve the electrostatic discharge protection effect generated by the conductive pattern 230, but not limited thereto.

Figure 8:
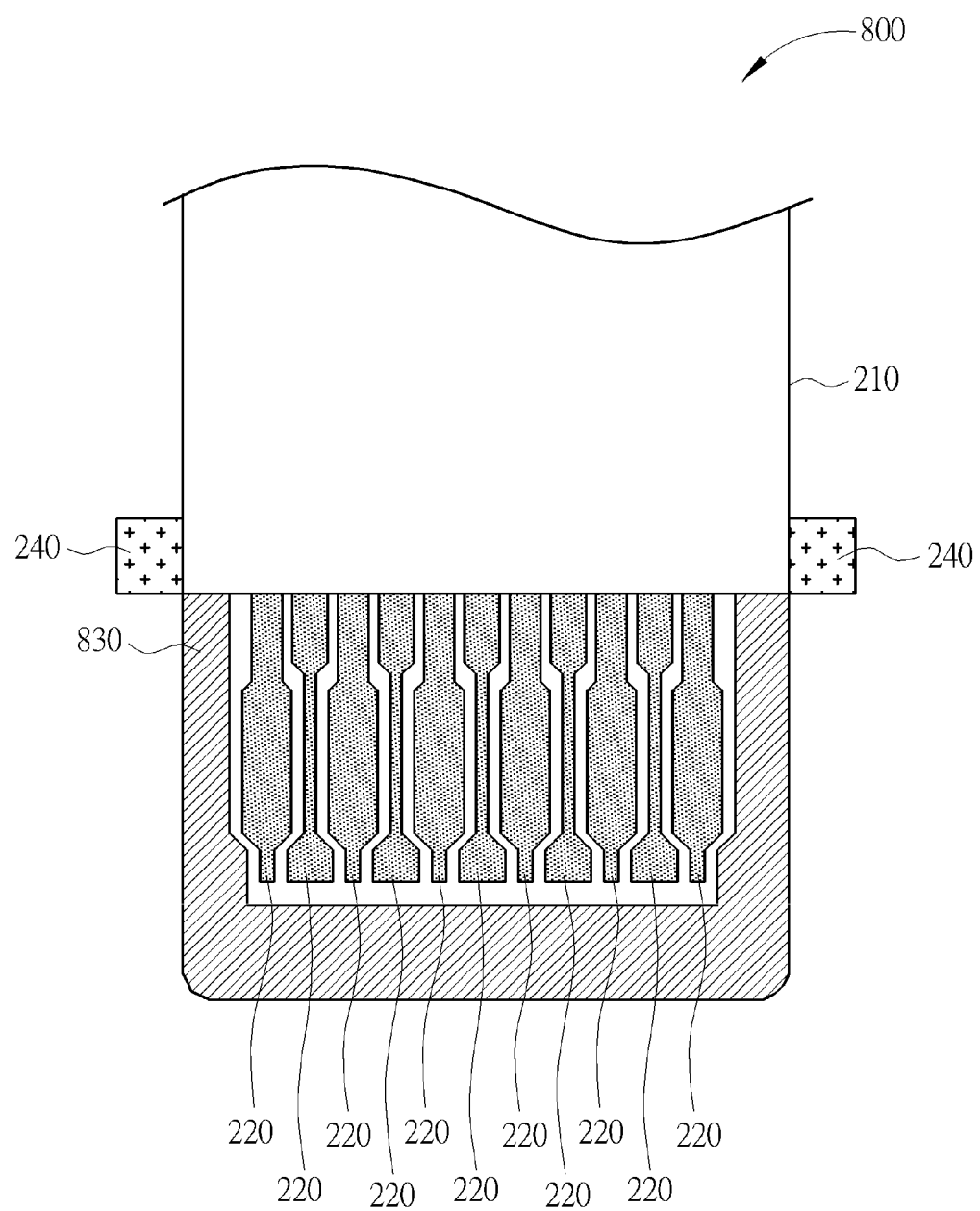
FIG. 8 is a schematic diagram illustrating a connection structure of an electronic device according to a seventh preferred embodiment of the present invention.

As shown in FIG. 8, the seventh preferred embodiment of the present invention provides a connection structure 800 of an electronic device. The connection structure 800 includes the circuit board 210, a plurality of conductive contact pads 220 and a conductive pattern 830. The conductive contact pads 220 and the conductive pattern 830 are disposed on the circuit board 210. The conductive pattern 830 is electrically insulated from the conductive contact pads 220. The conductive pattern 830 may surround the conductive contact pads 220 so as to generate an electrostatic discharge protection effect for the conductive contact pads 220. The conductive pattern 830 may include at least one of aluminum, copper, silver, chromium, titanium and molybdenum, a composite layer of the above-mentioned materials, an alloy of the above-mentioned materials, or other conductive materials. The difference between the connection structure 800 and the first preferred embodiment described above is that the conductive pattern 830 in this embodiment is preferably a U-shaped conductive pattern and the conductive pattern 830 is disposed on three sides of the conductive contact pads 220. In other words, as shown in FIG. 8, a relative upper side of the conductive contact pads 220 may not be surrounded by the conductive pattern 830. The through holes and the signal lines described above may not be required in this embodiment for transmitting signals to the conductive contact pads 220. The conductive contact pads 220 in this embodiment may be directly connected to other components, such as an integrated circuit (not shown), on the circuit board 210. The electrostatic discharge protection effect against external electrostatic discharges for the conductive contact pads 220 may be effectively enhanced by the design of the conductive pattern 830 disposed on the three sides of the conductive contact pads 220. Additionally, in this embodiment, an area of the conductive pattern 830 is preferably larger than a total area of the conductive contact pads 220 so as to effectively generate the required electrostatic discharge protection effect, but not limited thereto. It is worth noting that, similar to the embodiments described above, the conductive pattern 830 in this embodiment may also be electrically grounded by being electrically connected to the ground lines or the ground contact pads so as to further improve the electrostatic discharge protection effect generated by the conductive pattern 830, but not limited thereto.

To summarize the above descriptions, in the connection structure of the electronic device in the present invention, the conductive pattern is used to surround the conductive contact pads for generate the electrostatic discharge protection effect for the conductive contact pads and other components in the connection structure. Additionally, the conductive pattern may be electrically grounded by being electrically connected to the ground lines or the ground contact pads so as to further improve the electrostatic discharge protection effect generated by the conductive pattern. The conductive pattern may be directly disposed on the original connection structure to improve the electrostatic discharge protection effect, and the purpose of the electrostatic discharge protection enhancement may be achieved without altering the structural design greatly and increasing additional manufacture costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A connection structure of an electronic device, comprising:
   a circuit board;
   a plurality of conductive contact pads, disposed on the circuit board, wherein the conductive contact pads are electrically insulated from one another; and
   a conductive pattern, disposed on the circuit board, wherein the conductive pattern is disposed on at least three sides of the conductive contact pads so as to generate an electrostatic discharge protection effect for the conductive contact pads, wherein the conductive pattern surrounds the conductive contact pads, the conductive pattern includes a closed pattern having a hollow region, and all of the conductive contact pads are disposed in the hollow region.

2. The connection structure of claim 1, wherein an area of the conductive pattern is larger than a total area of the conductive contact pads.

3. The connection structure of claim 1, further comprising a plurality of signal lines, electrically connected to the conductive contact pads respectively,
   wherein the signal lines are electrically insulated from the conductive pattern.

4. The connection structure of claim 3, wherein the signal lines are disposed at a lower layer of the circuit board, and each of the signal lines is electrically connected to the corresponding conductive contact pad via a through hole in the circuit board.

5. The connection structure of claim 1, further comprising at least one ground line, electrically connected to the conductive pattern.

6. The connection structure of claim 1, further comprising at least one ground contact pad, wherein the conductive pattern contacts the ground contact pad so as to be electrically connected to the ground contact pad.

7. The connection structure of claim 1, further comprising at least one ground contact pad, electrically insulated from the conductive contact pads, wherein the conductive pattern surrounds the conductive contact pads and the ground contact pad.

8. The connection structure of claim 7, wherein the conductive pattern is electrically connected to the ground contact pad.

9. The connection structure of claim 1, further comprising a connector, disposed on the circuit board, wherein the connector is electrically connected to the conductive contact pads, and the conductive pattern surrounds the connector.

10. The connection structure of claim 1, further comprising an integrated circuit, disposed on the circuit board, wherein the conductive pattern surrounds the integrated circuit.

* * * * *